(12) United States Patent
Le Grand De Mercey

(10) Patent No.: US 8,169,267 B2
(45) Date of Patent: May 1, 2012

(54) WAVE REVERSING SYSTEM AND METHOD FOR A ROTARY TRAVELING WAVE OSCILLATOR

(75) Inventor: Gregoire Le Grand De Mercey, Menlo Park, CA (US)

(73) Assignee: Multigig, Inc., San Jose, CA (US)

( * ) Notice: Subject to any disclaimer, the term of this patent is extended or adjusted under 35 U.S.C. 154(b) by 0 days.

(21) Appl. No.: 12/532,628

(22) PCT Filed: Mar. 28, 2008

(86) PCT No.: PCT/US2008/058726
§ 371 (c)(1),
(2), (4) Date: Sep. 22, 2009

(87) PCT Pub. No.: WO2008/121857
PCT Pub. Date: Oct. 9, 2008

(65) Prior Publication Data
US 2010/0117748 A1    May 13, 2010

Related U.S. Application Data

(60) Provisional application No. 60/908,959, filed on Mar. 29, 2007.

(51) Int. Cl.
*H03K 3/03*    (2006.01)
(52) U.S. Cl. .................................. 331/57; 331/107 SL
(58) Field of Classification Search ............... 331/45, 331/46, 55, 57, 96, 107 SL
See application file for complete search history.

(56) References Cited

U.S. PATENT DOCUMENTS

| | | | |
|---|---|---|---|
| 4,086,543 A | 4/1978 | Nigrin | |
| 4,749,963 A | 6/1988 | Makimoto et al. | |
| 5,640,112 A | 6/1997 | Goto et al. | |
| 5,652,549 A | 7/1997 | Unterricker et al. | |
| 6,525,618 B2 * | 2/2003 | Wood | 331/57 |

(Continued)

FOREIGN PATENT DOCUMENTS

DE    4322701 C1    8/1994

(Continued)

OTHER PUBLICATIONS

A Dynamic Formulation of Ring Oscillator as Solitary Wave Propagator, 1998 IEEE Transactions on Circuits and Systems, vol. 45, No. 1 Jan. 1998.

(Continued)

*Primary Examiner* — Levi Gannon
(74) *Attorney, Agent, or Firm* — Maryam Imam; IPxLaw Group LLP

(57) ABSTRACT

Circuitry for establishing a traveling wave on a rotary traveling wave oscillator is described. The circuitry includes a gain portion that establishes a wave in a preferred direction by degenerating any wave traveling opposite to the preferred direction and regenerating any wave traveling in the preferred direction. If there are two such gain portions, each having opposite preferred directions, then a wave that is presently established in one direction can be degenerated and a new wave can be established in the opposite direction, thereby achieving reversibility of the traveling wave in real time. Each of the gain portions included in a plurality of regeneration/degeneration elements present on the rotary oscillator. Each of the regeneration/degeneration elements is connected to a pair of taps on the oscillator, the taps being separated by a direction dependent phase difference.

23 Claims, 10 Drawing Sheets

U.S. PATENT DOCUMENTS

| | | | |
|---|---|---|---|
| 6,816,020 B2 | 11/2004 | Wood | |
| 7,218,180 B2 * | 5/2007 | Wood | 331/96 |
| 7,236,060 B2 * | 6/2007 | Wood | 331/57 |
| 7,307,483 B2 * | 12/2007 | Tzartzanis et al. | 331/57 |
| 7,545,225 B2 * | 6/2009 | Beccue | 331/57 |
| 7,616,070 B2 | 11/2009 | Tzartzanis et al. | |
| 2003/0006851 A1 | 1/2003 | Wood | |
| 2004/0222859 A1 | 11/2004 | Hajimiri et al. | |

FOREIGN PATENT DOCUMENTS

| | | |
|---|---|---|
| EP | 0478134 | 8/1991 |
| EP | 0891045 | 1/1999 |
| GB | 01/02069 | 11/2001 |
| JP | 60224205 | 11/1985 |
| JP | 04165809 | 6/1992 |

OTHER PUBLICATIONS

Generation of Traveling Wave Mode in a Chained Neural Oscillator Network Model, IEEE May 1993, Department of Electrical and Electronic Engineering, Faculty of Engineering, the University of Tokushima, Japan.

Minaturized Stripline Dual-mod Ring Resonators and Their Application to Oscillating Devices, 1995 IEEE, Information and Communications Technology Laboratory, Matsushita Electric Industrial Co. Ltd. Kawasaki, Japan.

Rotary Traveling-Wave Oscillator Arrays: A New Clock Technology, IEEE Journal of Solid-State Circuits, vol. 36, No. 11, Nov. 2001.

* cited by examiner

WAVE REVERSING SYSTEM AND METHOD FOR A ROTARY TRAVELING WAVE OSCILLATOR

BACKGROUND

A rotary traveling wave oscillator is described in U.S. Pat. No. 6,556,089, which is incorporated by reference into the present application. In that patent, a wavefront moves around a closed, differential loop, reversing its polarity in each transit of the loop. The wavefront traveling on the loop is established and maintained by a plurality of regeneration elements, such as back-to-back inverters, distributed about the entire loop, in one embodiment. FIG. 1 shows an embodiment 10 of a back-to-back inverter 12, 14. The result of this arrangement is that at any point on the differential loop, a differential clock signal is available. The frequency of the clock signal is determined by the electrical size of the loop, by which is meant the time it takes to make a lapse around the loop, given the loop's loaded transmission line characteristics.

PCT/GB01/02069, which is incorporated by reference into the present application, describes an embodiment, shown in FIG. 12B, in which circuitry biases the wave so that it travels in a preferred direction, either clockwise or counter clockwise. According to this application, the direction of the traveling wave is not changeable once the wave had been established on the loop. See PCT/GB01/02069, page 7, lines 24-25. That is, to change the direction of the wave, one would have to cycle power the loop and re-start the wave in the opposite direction. While this startup circuitry accomplishes the function of assuring that the traveling wave moves in a preferred direction, it would be desirable to establish the direction of the traveling wave without cycling power the loop, i.e., to change the direction of the wave in real time.

SUMMARY OF INVENTION

The present invention, in one embodiment, is directed towards circuitry that can change the direction of the traveling wave on the rotary oscillator without having to power down the loop, in effect, changing the direction of the wave in real time, i.e., while the wave is traveling in either one of the directions. The present invention includes one or more regeneration/degeneration elements, each of which includes circuitry for regenerating or degenerating a wave traveling in a particular direction. The new regeneration/degeneration elements employ a positive resistance to degenerate a wave traveling in a particular direction and negative resistance to establish and maintain the wave in the opposite direction.

The present invention in another embodiment is directed towards circuitry that can establish a wave on a rotary oscillator traveling in a preferred direction. The present invention includes one or more regeneration/degeneration elements, each of which includes circuitry for regenerating a wave traveling in the preferred direction and degenerating a wave traveling opposite to the preferred direction.

BRIEF DESCRIPTION OF DRAWINGS

These and other features, aspects and advantages of the present invention will become better understood with regard to the following description, appended claims, and accompanying drawings where:

DETAILED DESCRIPTION

Figure 1:
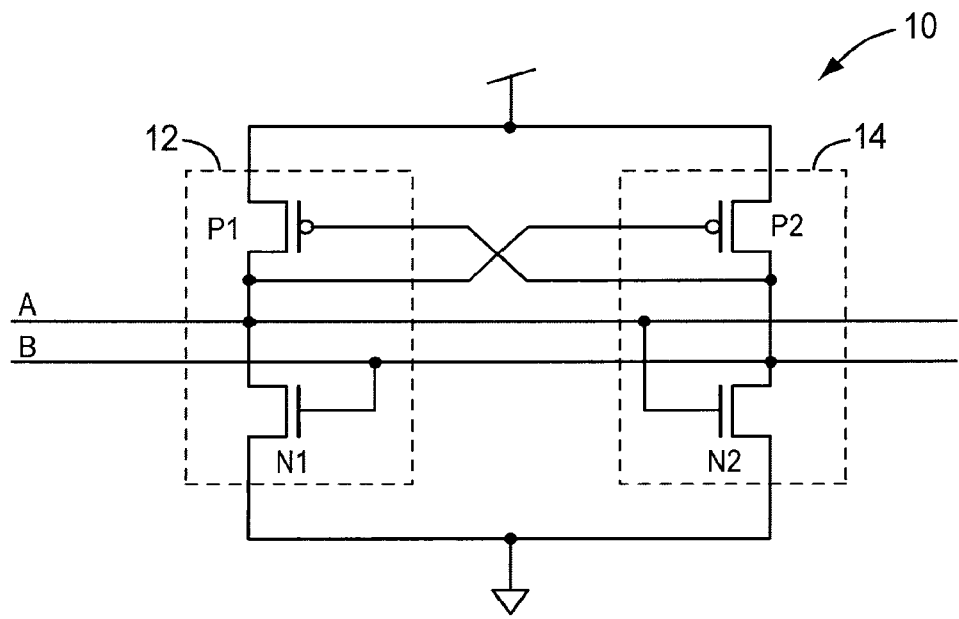
FIG. 1 shows a prior art circuit for a regeneration device.
Figure 2A:
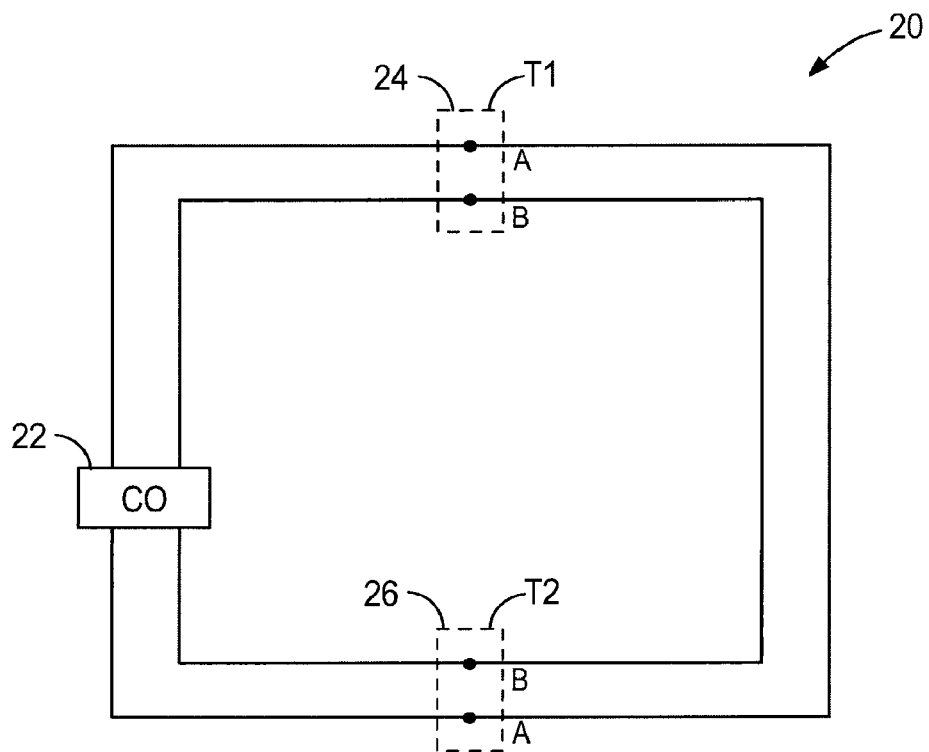
FIG. 2A shows a simplified diagram of the rotary traveling wave oscillator.

FIG. 2A shows a simplified diagram of the rotary traveling wave oscillator 20. The oscillator 20 includes one or more regeneration/degeneration elements (shown in FIG. 7) and a crossover CO 22, which reverses the polarity of a differential wave traveling on the conductors of the oscillator. The figure also shows two points T1 24 and T2 26 at which the conductors of the oscillator are tapped by a representative regeneration/degeneration element ("redegen" element).

In the discussion that follows, a convention for naming the wavefront is helpful. The relatively more positive wavefront is named the 0 degree wavefront, so that 180 degrees is the relatively more negative wavefront. A traveling wave thus has the following wavefronts that travel past a specific point, 0, 90, 180, 270, 360.

Figure 2B:
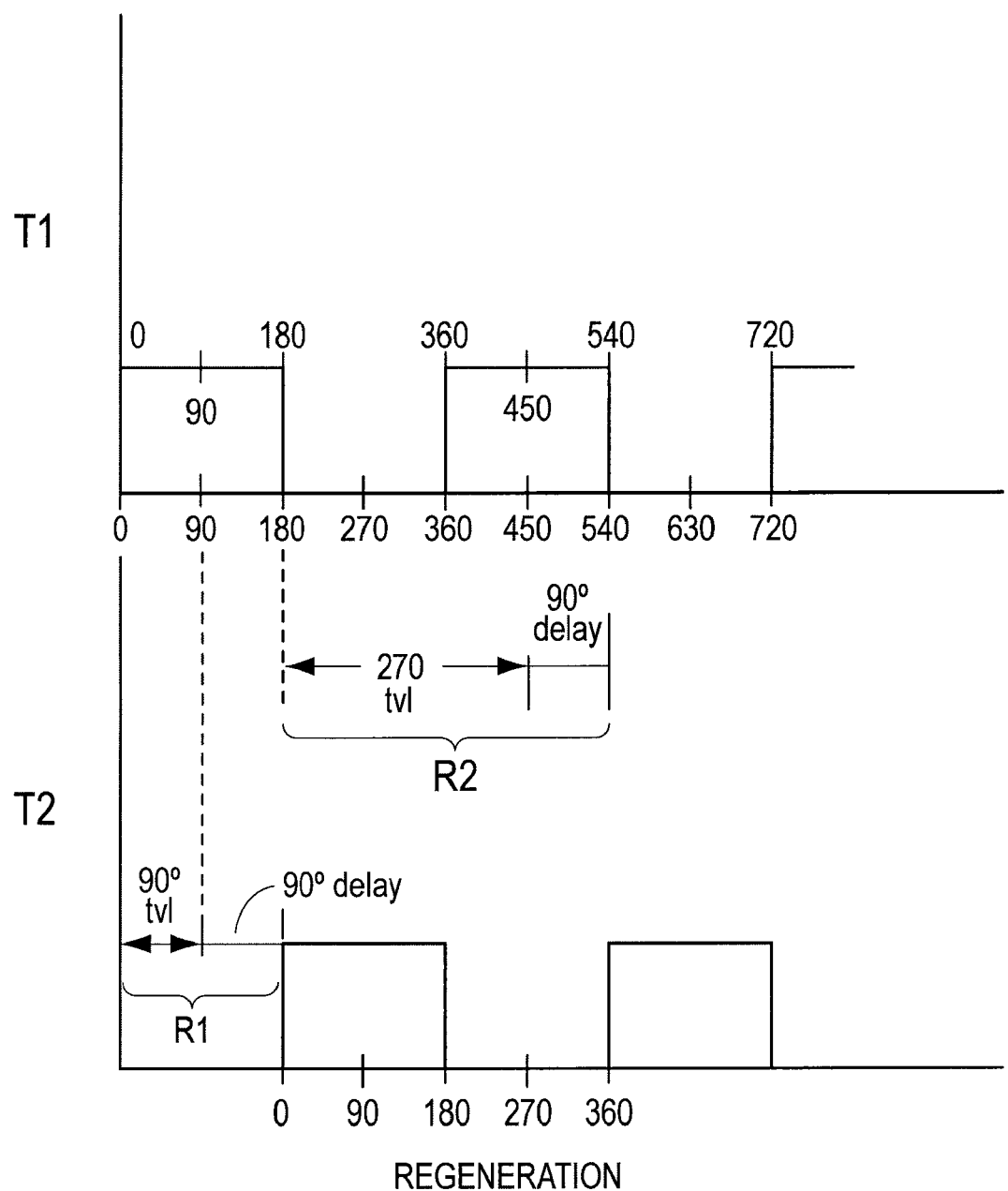
FIGS. 2B and 2C are timing diagrams that illustrate cases of regeneration and degeneration of a traveling wave.
Figure 2C:
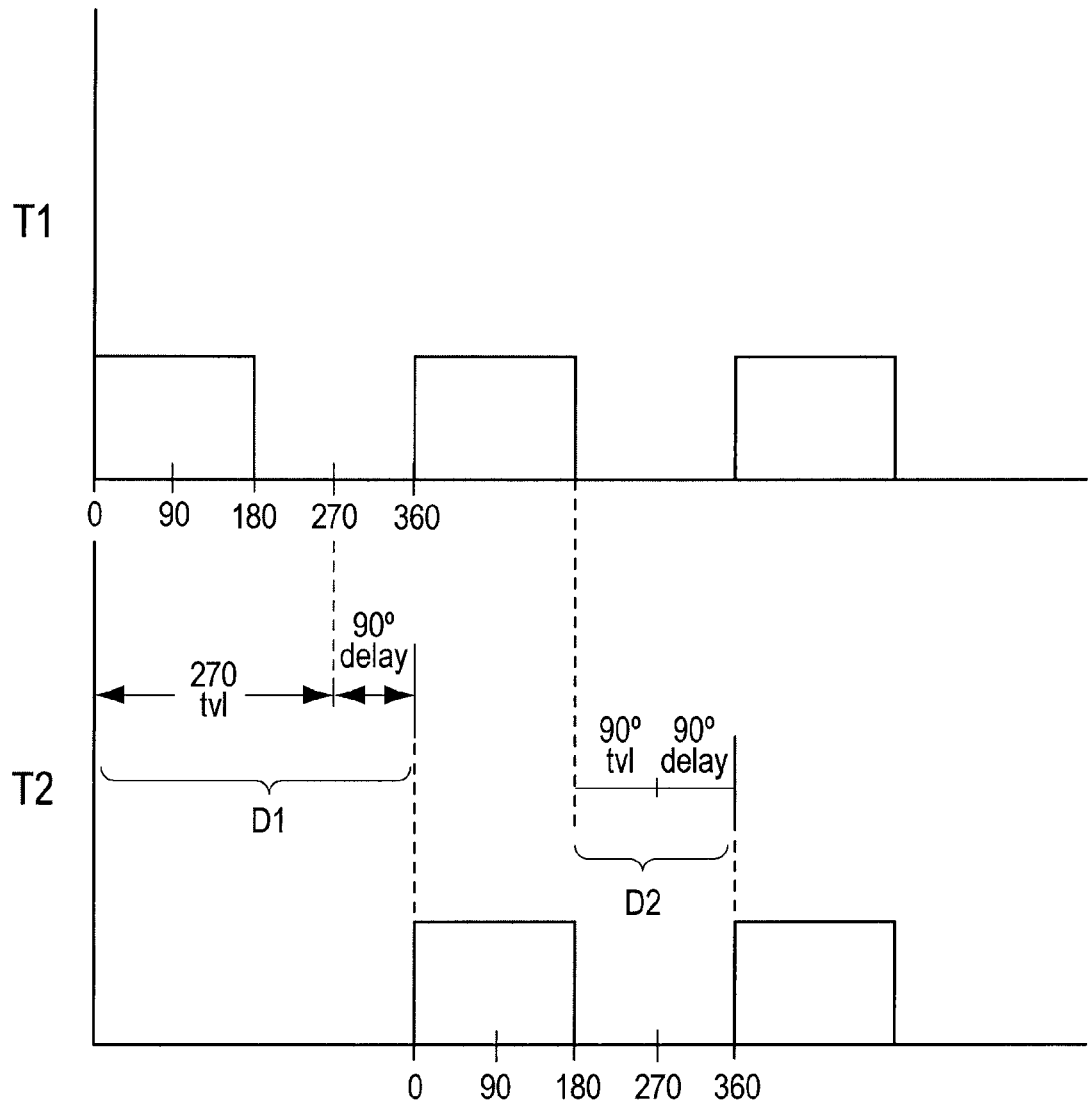

FIGS. 2B and 2C are timing diagrams that illustrate the cases in which regeneration or degeneration of a wave occurs. FIG. 2B shows the cases where there is regeneration and FIG. 2C shows the cases where there is degeneration.

Regeneration occurs, as illustrated in FIG. 2B, when the wave at T1 is 180 degrees out of phase with the wave at T2. There are two cases. The first case occurs when a 0 degree T2 wavefront at T2 has traveled 90 degrees from the 0 degree wavefront at T1, and a 90 degree external delay is added. The second case occurs when a 180 degree wavefront at T2 wave has traveled 270 degrees from the 180 degree wavefront at T1 wave, and a 90 degrees external delay is added. These two conditions, R1 and R2 in FIG. 2B, are expressed as follows, R1(0+$\overrightarrow{90}$,+90), R2(180+$\overrightarrow{270}$,+90), where the arrow indicates a delay caused by the travel of the wave and the +90 indicate a delay caused by delay external to the oscillator.

Degeneration occurs, as illustrated in FIG. 2C, when the wave at T1 is in phase with the wave at T2. Again, there are two cases to consider. In the first case, a 0 degree wavefront at T2 wave has traveled 270 degrees from the 0 degree wavefront at T1 wave, and a 90 degree delay is added. In the second case, the 180 degree wavefront at T2 has traveled 90 degrees from the 180 degree wavefront at T1, and a 90 degree delay is added. These two conditions D1, D2, are expressed as D1(0+$\overrightarrow{270}$,+90), D2(180+$\overrightarrow{90}$,+90).

Figure 3:
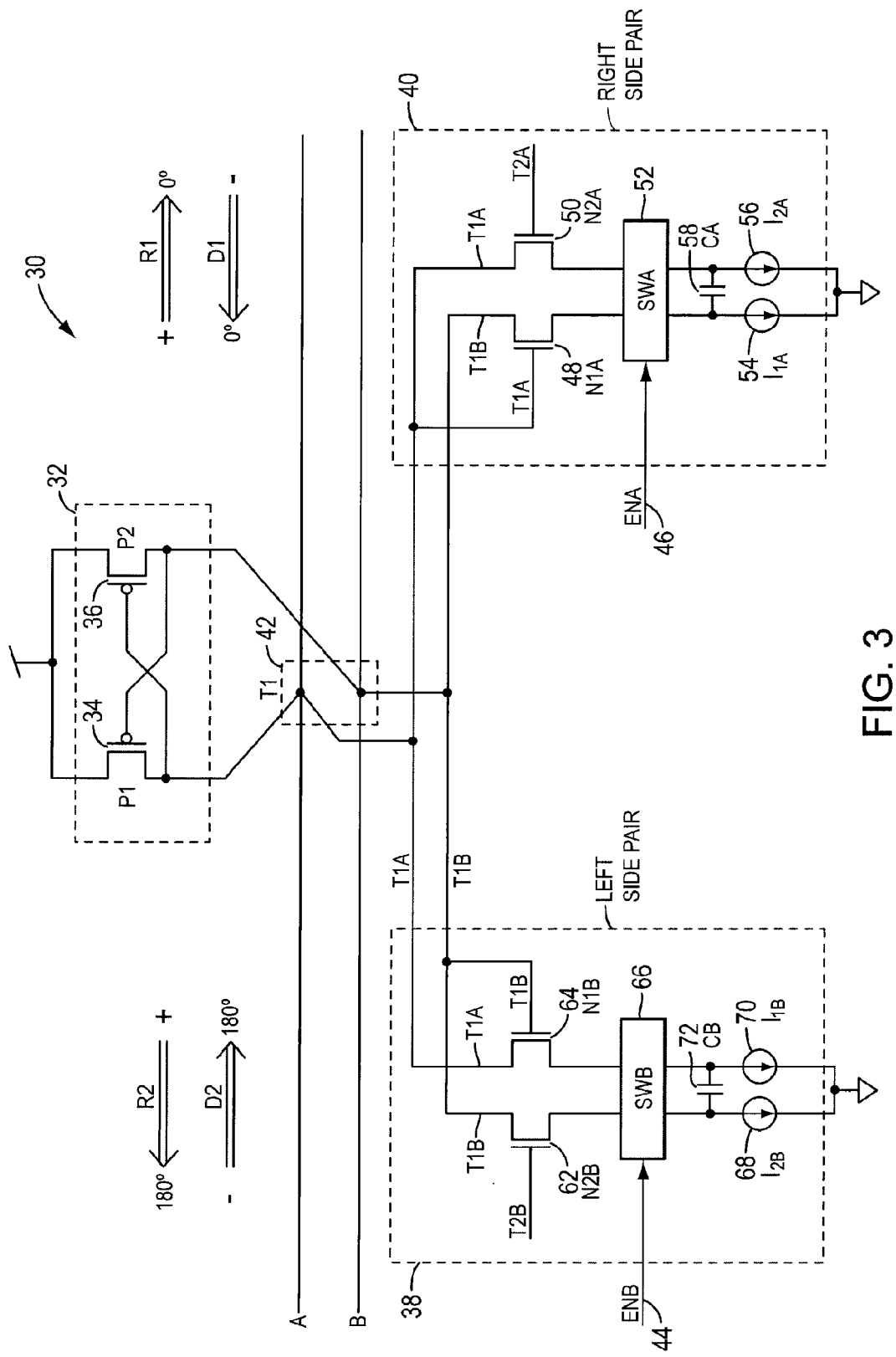
FIG. 3 shows a simplified diagram of an embodiment of the present invention.

FIG. 3 shows a simplified diagram of a representative regeneration/degeneration element 30 of the present invention. In this element, there is a pair of load devices 32, such as PFETs P1 34 and P2 36 that are cross-coupled to each other, and two pairs 38, 40 of transistors on either side of the load devices 32. Alternatively, the load devices 32 can be resistors, NMOS devices with resistive loading, or NMOS devices with PMOS diodes. Active load devices need only to provide a gain over a phase range of 0 to 180 degrees. The transistor pairs 38, 40 are connected to the A and B conductors at the same tap point (T1) 42 as the load devices.

The right side transistor pair 40 is configured to supply energy to a wave traveling in the clockwise direction (to the right in the figure), and to remove energy from a wave traveling in the counter clockwise direction (to the left in the figure). The left side transistor pair 38 is configured to supply energy to a wave traveling in the counter clockwise direction (to the left in the figure) and to remove energy from a wave traveling in the clockwise direction. The operation of each pair is selectable by an enable signal EN 44, 46. Only one pair is operative at a time.

The right side pair of transistors includes two NFETs N1A 48 and N2A 50. The first NFET N1A 48 has its gate connected to T1A, which is the A conductor at tap point T1 42, and its drain connected to T1B, the B conductor at the T1 42 tap point. The second NFET N2A 50 has its drain connected to T1A and its gate connected to T2A. When the wave travels to the right, the T2A point is 90 degrees away (later) from the T1A point and when the wave travels to the left, the T2A point is 270 degrees away from the T1A point. The sources of N1A 48 and N2A 50 are connected to a switch SWA 52 that connects, when closed, each of the drains to a current source, I1A 54, I2A 56. The switch SWA 52 has an enable input ENA 46 that makes the right side pair 40 operative. A capacitor CA 58 is connected between the two current sources 54, 56 and, in combination with the transistors N1A 48 and N2A 50, creates a 90 degree delay to full conduction of the N2A 50 FET. The capacitor 58 itself provides a 45 degree delay and the timing of the signals connected to the gates of T1A and T2A provides an additional 45 degrees, for a total of 90 degrees.

The left side pair 38 includes two NFETS N1B 62, N2B 64. The first NFET N1B 64 has its gate connected to T1B conductor and its drain connected to the T1A conductor. The second NFET N2B 62 has its drain connected to T1B conductor and its gate connected to the T2B conductor. When the wave travels to the left, the T2B point is 270 degrees delayed from the T1B point, because it travels past the crossover CO 22 in FIG. 2A. When the wave travels to the right, the T2B point is 90 degrees delayed from the T1B point. The sources of the NFETS are connected to a switch SWB 66 that connects, when closed, each of the drains to a current source I1B 68, I2B 70. The switch SWB 66 has an enable input ENB 44 that makes the left side pair 38 operative. A capacitor CB 72 is connected between the two current sources 68, 70 and in combination with the transistors N1B 64 and N2B 62 creates a 90 degree delay to full conduction of the N2B 62 FET. The capacitor 72 itself provides a 45 degree delay and the timing of the gate signals provides an additional 45 degrees, for a total of 90 degrees.

For the operation of the right side pair 40 of transistors, there are two cases to consider, R1(0+$\overrightarrow{90}$,+90) and D1(0+$\overrightarrow{270}$,+90). For the operation of the left side pair 38 of transistors, the two cases are R2(180+$\overrightarrow{270}$,+90) and D2(180+$\overrightarrow{90}$,+90).

In the R1(0+$\overrightarrow{90}$,+90) case, with the 0 degree wavefront traveling clockwise (not passing the crossover), the N2A 50 transistor provides energy to the traveling wave. This occurs because the drain of the N2A transistor is connected to T1 while the gate is connected to T2, thereby making the drain relatively more negative than the gate. The current source I2A 56 is thus connected via N2A to the negative side of the wave so that it makes the negative side more negative, thereby adding to the energy of the wave.

In the D1(0+$\overrightarrow{270}$,+90) case, with the 0 degree wavefront traveling counter clockwise (passing the crossover), the N2A 50 transistor takes energy from the traveling wave. This occurs because the drain and gate are at the same potential. The current source I2A 56 is thus connected via N2A 50 to the more positive side of the wave so that it makes the positive side more negative, thereby removing energy from the wave.

In the R2(180+$\overrightarrow{270}$,+90) case, with the 180 degree wavefront traveling counter clockwise (passing the crossover), the N2B transistor 62 provides energy to the traveling wave. This occurs because the drain of N2B 62 is connected to T1 while the gate is connected to T2, thereby making the drain relatively more negative than the gate. The I2B current source 68 is thus connected via N2B 62 to the relatively more negative side of the wave, so that it adds energy to the wave.

In the D2(180+$\overrightarrow{90}$,+90) case, with the 180 degree wavefront traveling clockwise, the N2B 62 transistor removes energy from the traveling wave. This occurs because the drain and gate of N2B 62 are at the same potential (both relatively positive). The current source I2B 68 is connected via N2B 62 to the more positive side of the wave so that it makes this side of the wave more negative, thereby removing energy from the wave.

In the D1 and D2 cases, the degeneration of the wave is greater than any regeneration of the wave provided by the load devices and the wave thus decays to the point where no wave traveling in the direction for which degeneration occurs. As mentioned above, the degeneration is greater because the NMOS transistor N1B 64 or N2B 62 is stronger than either of the PMOS transistors 34, 36.

A wave traveling on the rotary traveling wave oscillator may be reversed. If a wave is traveling in the clockwise direction, according to R1, and it is desired to have the wave travel in the counter clockwise direction, then the right side pair 40 is turned off and the left side pair 38 is turned on. This, in effect, causes a change from the R1 case to the D2 case, and then to the R2 case. The wave traveling in the clockwise direction is degenerated according to the D2 case, and a new wave starts in the counter clockwise direction according to case R2.

Alternatively, if the wave is traveling in the counter clockwise direction, according to the R2 case and it is desired to have the wave travel in the clockwise direction, then the left side pair 38 is turned off and the right side pair 40 is turned on. This causes a change from the R2 to the D1 case, and then to the R1 case. The change from the R2 case to the D1 case degenerates the wave and a new wave starts in the clockwise direction according to the R1 case.

Alternatively, it is possible to establish a wave traveling in a preferred direction.

If only one of the transistor pairs is present, a wave can be established in a preferred direction by the pair that is present. If the right side pair 40 is present, the pair 40 establishes a traveling wave in the clockwise direction. If the left side pair 38 is present, the pair 38 establishes a traveling wave in the counterclockwise direction.

Figure 4:
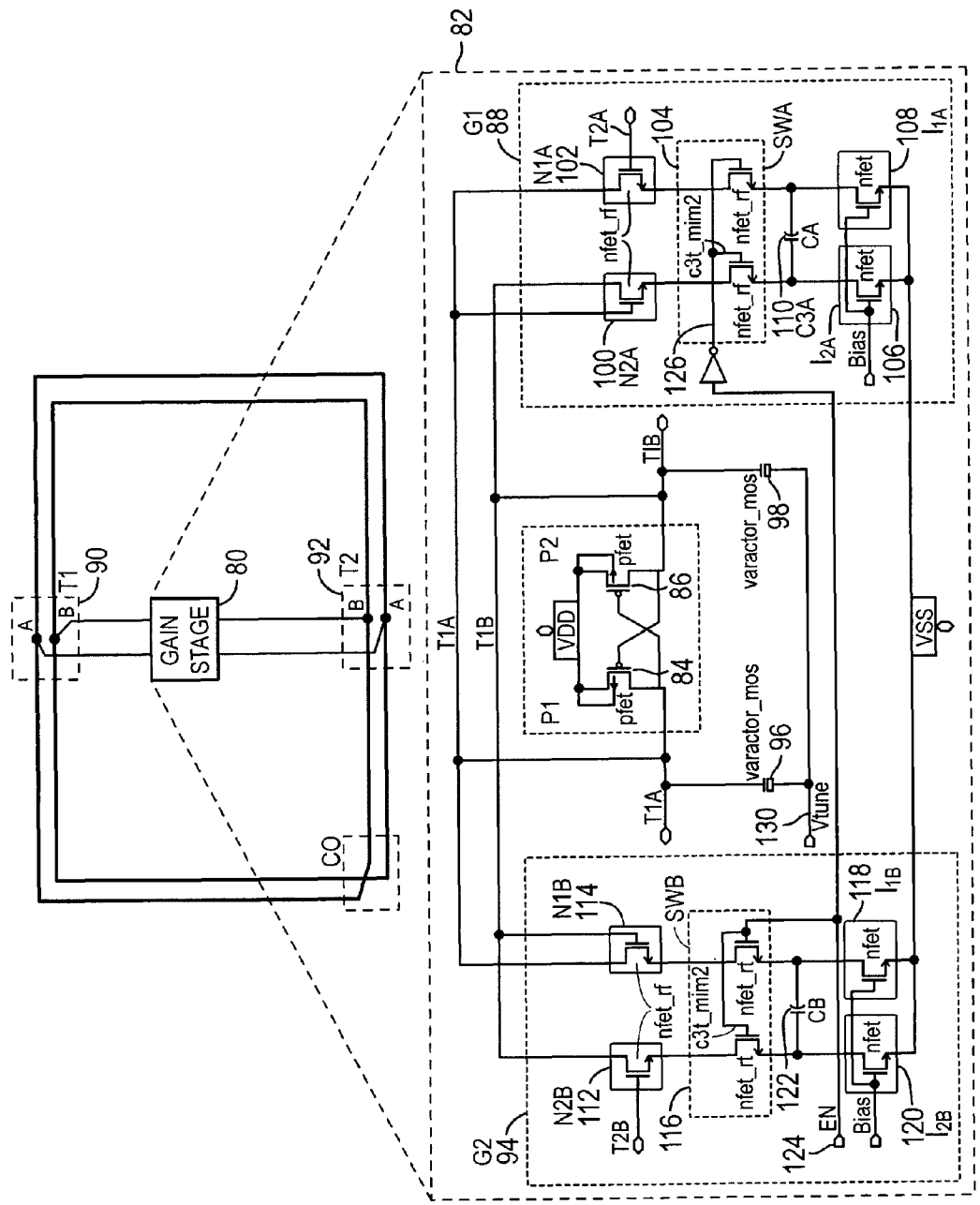
FIG. 4 shows a more detailed schematic of an embodiment of the present invention.

FIG. 4 shows a more detailed diagram of the new wave reversing elements. In this figure, the rotary clock has an exemplary gain stage connected between the T1 point and the T2 point. The rotary clock has a single crossover shown between T1 and T2. The T2 A and B points may be slightly different from 90/270 degrees to compensate for any parasitic capacitances in the circuit.

The exemplary gain stage 80 shown in the figure represents one or more gain stages connected in a similar fashion to the rotary oscillator. The exemplary gain stage 80 has an expanded version shown in the inset 82 and includes the P1 84 and P2 86 FETs, a gain stage portion G1 88 connected to the A and B conductors of the T1 tap 90 and to the A conductor of the T2 tap 92, a gain stage portion G2 94 connected to the T1 tap 90 and to the B conductor of the T2 tap 92, and a pair of varactors 96, 98 connected to the T1A and T1B points for tuning the oscillator. The P1 84 and P2 86 FETs are connected in a cross-coupled fashion and switch when the traveling wave arrives at the T1 tap 90. The G1 stage 88 includes N1A 100 and N2A 102 transistors, an enabling switch SWA 104, the I1A 106 and I2A 108 current sources and the capacitor C3A 110. The G2 stage 94 includes N1B 112 and N1B 114 transistors, an enabling switch SWB 116, the I1B 118 and I2B 120 current sources, and the capacitor C3B 122. The P1 and P2 84, 86 transistors are weaker than the N1B 114 and N2B 112 transistors, so that the degeneration of an existing wave is possible. In one embodiment, the transistors are ⅓ weaker than the N1B 114 and N2B 112 transistors.

The SWA 104 and SWB 116 switches include a pair of NFET transistors whose gates are connected to enable signals, ENA 126 and ENB 124, respectively. In one embodiment, the enable signal ENA 126 of the SWA 104 switch is the inversion of the enable signal ENB 124 of the SWB 116 switch. The current sources 106, 108, 118, 120 are implemented with NFETs and a voltage vb2, vb3 biases these NFETs for constant current. The capacitors C3A 110 and C3B 122 are sized to delay the turning on of either the N2A 100 and N2B 112 transistors by 45 degrees in addition to the 45 degree delay caused by the gates being out of phase by 90 degrees. The varactors 96, 98 connected at the T1 tap point are both connected to a $V_{TUNE}$ voltage 130. This helps to adjust the frequency of the rotary oscillator. Operation of FIG. 4 is substantially the same as that described in relation to FIG. 3.

Rotary Traveling Wave Oscillator

Figure 5:
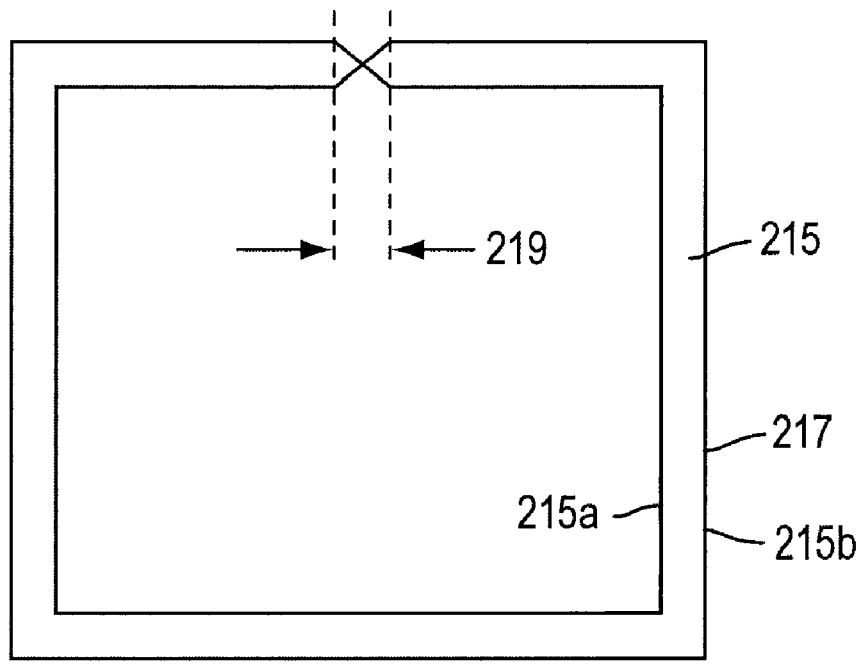
FIG. 5 is an outline diagram for a transmission-line structure hereof.

FIG. 5 shows such a transmission-line 15 as a structure that is further seen as physically endless, specifically comprising a single continuous "originating" conductor formation 217 shown forming two appropriately spaced generally parallel traces as loops 215a, 215b with a cross-over at 219 that does not involve any local electrical connection of the conductor 217. Herein, the length of the originating conductor 217 is taken as S, and corresponds to two 'laps' of the transmission-line 215 as defined between the spaced loop traces 215a, 215b and through the cross-over 219.

Figure 6:
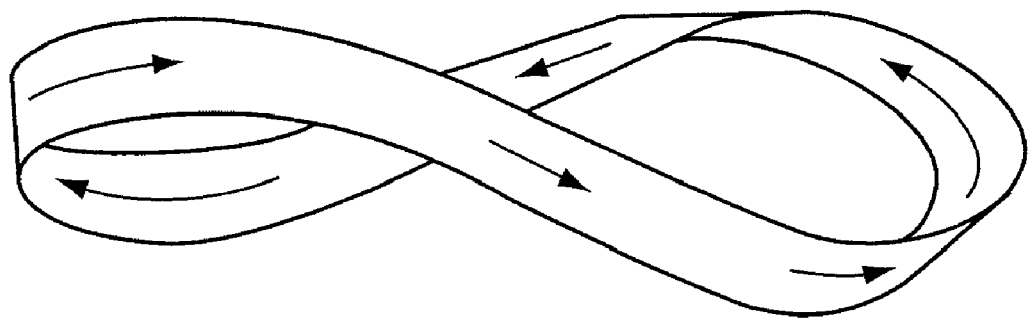
FIG. 6 shows a Moebius strip.

This structure of the transmission-line 215 has a planar equivalence to a Moebius strip, see FIG. 6, where an endless strip with a single twist through 180° has the remarkable topology of effectively converting a two-sided and two-edged, but twisted and ends-joined, originating strip to have only one side and one edge, see arrows endlessly tracking the centre line of the strip. From any position along the strip, return will be with originally left- and right-hand edges reversed, inverted or transposed. The same would be true for any odd number of such twists along the length of the strip. Such a strip of conductive material would perform as required for signal paths of embodiments of this invention, and constitutes another structural aspect of invention. A flexible substrate would allow implementing a true Mobius strip transmission-line structure, i.e. with graduality of twist that could be advantageously compared with planar equivalent cross-over

19. A flexible printed circuit board so formed and with its ICs mounted is seen as a feasible proposition.

Figure 7:
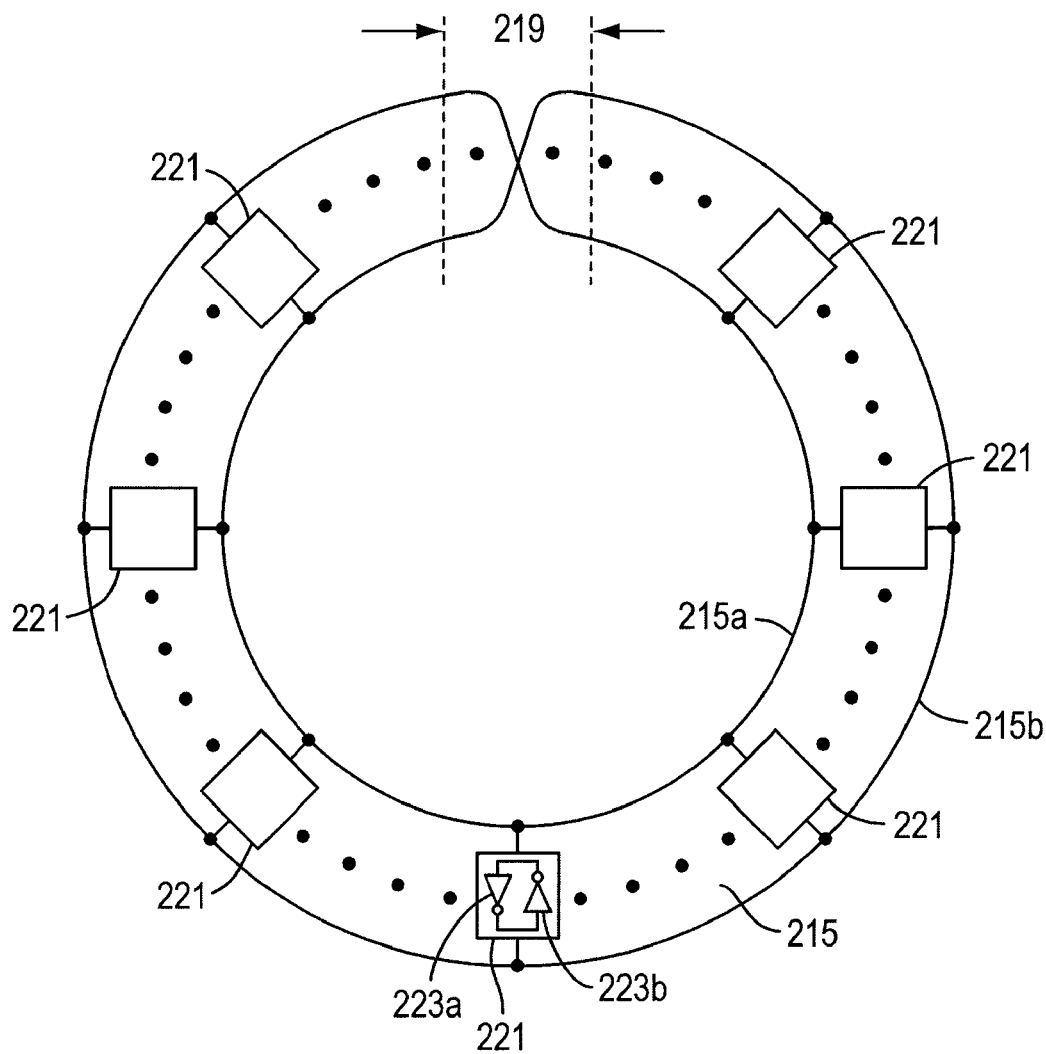
FIG. 7 is an outline circuit diagram for a traveling wave oscillator hereof.

FIG. 7 is a circuit diagram for a pulse generator, actually an oscillator, using the transmission-line 215 of FIG. 5, specifically further having plural spaced regenerative active means conveniently as bi-directional inverting switching/amplifying circuitry 221 connected between the conductive loop traces 215a, 215b. The circuitry 221 is further illustrated in this particular embodiment as comprising two inverters 223a, 223b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 221 is plural and distributed along the transmission-line 215, further preferably evenly, or substantially evenly; also in large numbers say up to 100 or more, further preferably as many and each as small as reasonably practical.

Inverters 223a, 223b of each switching amplifier 221 will have the usual operative connections to relatively positive and negative supply rails, usually V+ and GND, respectively. Respective input/output terminals of each circuit 221 are shown connected to the transmission-line 215 between the loops 215a, 215b at substantially maximum spacing apart along the effectively single conductor 217, thus each at substantially halfway around the transmission-line 215 relative to the other.

Figure 8:
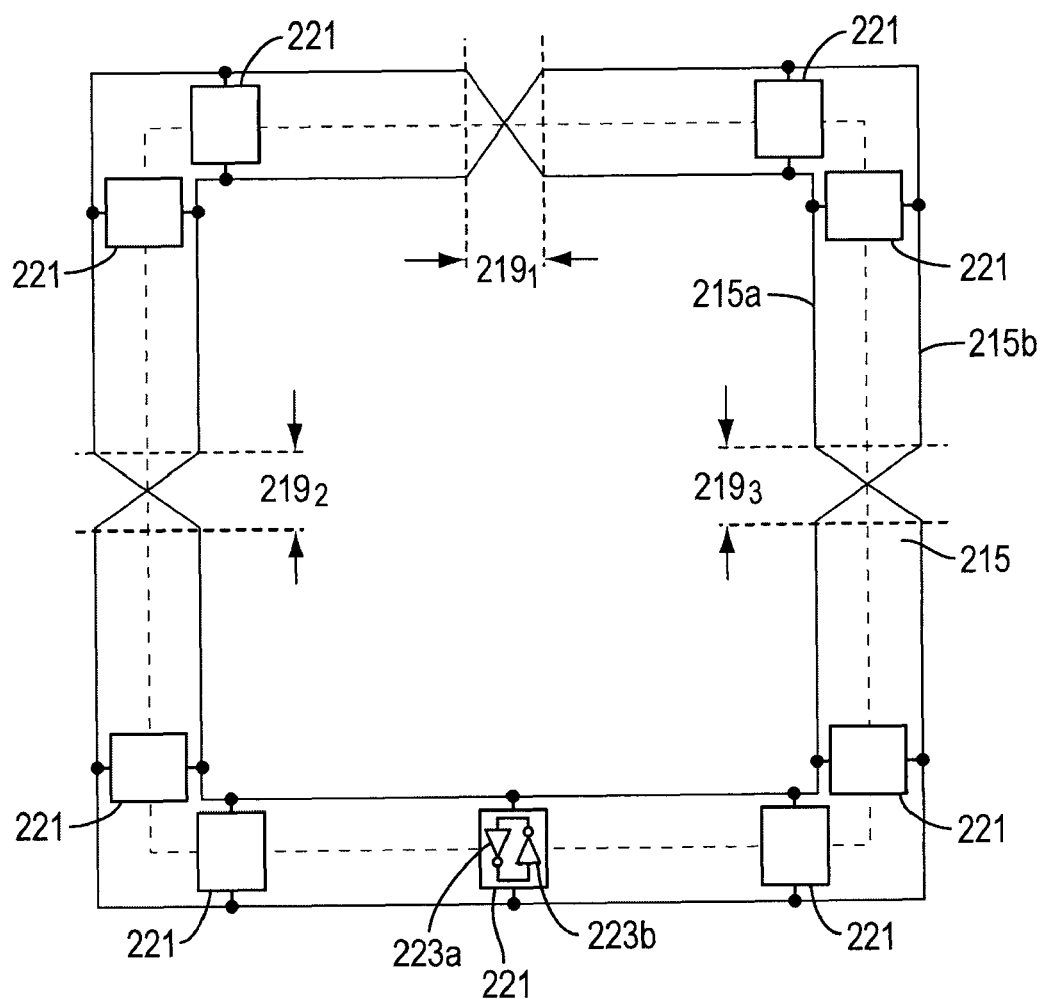
FIG. 8 is another outline circuit diagram for a traveling wave oscillator hereof.

FIG. 8 is another circuit diagram for an oscillator using a transmission-line structure hereof, but with three cross-overs 219₁, 219₂ and 219₃, thus the same Moebius strip-like reversing/inverting/transposing property as applies in FIG. 7.

The rectangular and circular shapes shown for the transmission-line 215 are for convenience of illustration. They can be any shape, including geometrically irregular, so long as they have a length appropriate to the desired operating frequency, i.e. so that a signal leaving an amplifier 221 arrives back inverted after a full 'lap' of the transmission-line 215, i.e. effectively the spacing between the loops 215a,b plus the crossover 219, traversed in a time Tp effectively defining a pulse width or half-cycle oscillation time of the operating frequency.

Advantages of evenly distributing the amplifiers 221 along the transmission-line 215 are twofold. Firstly, spreading stray capacitance effectively lumped at associated amplifiers 221 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 215 better to compensate for losses associated with the transmission-lines dielectric and conductor materials. A continuous closed-loop transmission-line 215 with regenerative switching means 221 substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/(2\pi\sqrt{L_e C_e})$ that is greater than the self-sustaining oscillating frequency F (F3, F5 etc.) of the transmission-line 215.

Figure 9A:
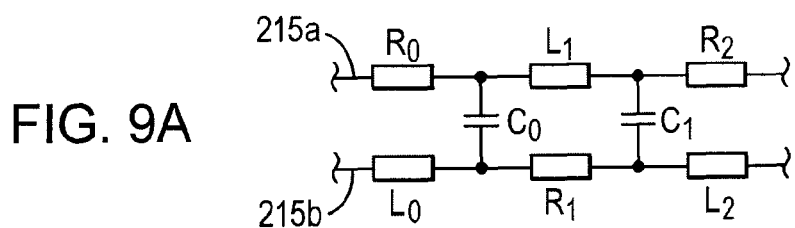
FIGS. 9a and 9b are equivalent circuits for distributed electrical models of a portion of a transmission-line hereof.

FIG. 9a is a distributed electrical equivalent circuit or model of a portion of a transmission-line 215 hereof It shows alternate distributed resistive (R) and inductive (L) elements connected in series, i.e. $R_0$ connected in series with $L_1$ in turn connected in series with $R_2$ and so on for a portion of loop 215a, and registering $L_0$ connected in series with $R_1$ in turn connected in series with $L_2$ and so on for the adjacent portion of loop 215b; and distributed capacitive elements $C_0$ and $C_1$ shown connected in parallel across the transmission-line 15 thus to the loops 215a and 215b between the resistive/inductive elements $R_0/L_1$ and the inductive/resistive elements $L_0/R_1$, respectively for $C_0$ and between the inductive/resistive elements $L_1/R_2$ and the resistive/inductive elements $R_1/L_2$, respectively for $C_1$: where the identities $R_0=R_1=R_2$, $L_0=L_1=L_2$ and $C_0=C_1$ substantially hold and the illustrated distributed RLC model extends over the whole length of the transmission-line 215. Although not shown, there will actually be a parasitic resistive element in parallel with each capacitive element C, specifically its dielectric material.

Figure 9B:
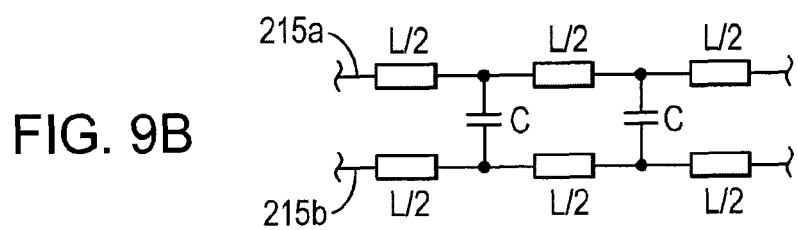

FIG. 9b is a further simplified alternative distributed electrical equivalent circuit or model that ignores resistance, see replacement of those of FIG. 9a by further distribution of inductive elements in series at half (L/2) their value (L) in FIG. 9a. This model is useful for understanding basic principles of operation of transmission-lines embodying the invention.

During a 'start-up' phase, i.e. after power is first applied to the amplifiers 221, oscillation will get initiated from amplification of inherent noise within the amplifiers 221, thus begin substantially chaotically though it will quickly settle to oscillation at a fundamental frequency F, typically within nanoseconds. For each amplifier 221, respective signals from its inverters 223a and 223b arrive back inverted after experiencing a propagation delay Tp around the transmission-line 215. This propagation delay Tp is a function of the inductive and capacitive parameters of the transmission-line 215; which, as expressed in henrys per meter (L) and in farads per meter (C) to include all capacitive loading of the transmission-line, lead to a characteristic impedance Zo=SQR (L/C) and a line traverse or propagation or phase velocity-Pv=1/SQRT(L/C). Reinforcement, i.e. selective amplification, of those frequencies for which the delay Tp is an integer sub-divisor of a half-cycle time gives rise to the dominant lowest frequency, i.e. the fundamental frequency F=1/(2·Tp), for which the sub-divisor condition is satisfied. All other integer multiples of this frequency also satisfy this sub-divisor condition, but gain of the amplifiers 21 'falls off', i.e. decreases, for higher frequencies, so the transmission-line 215 will quickly settle to fundamental oscillation at the frequency F.

The transmission-line 215 has endless electromagnetic continuity, which, along with fast switching times of preferred transistors in the inverters 223a and 223b, leads to a strongly square wave-form containing odd harmonics of the fundamental frequency F in effectively reinforced oscillation. At the fundamental oscillating frequency F, including the odd harmonic frequencies, the terminals of the amplifiers 221 appear substantially unloaded, due to the transmission-line 215 being 'closed-loop' without any form of termination, which results very desirably in low power dissipation and low drive requirements. The inductance and capacitance per unit length of the transmission-line 215 can be altered independently, as can also be desirable and advantageous.

Figure 10:
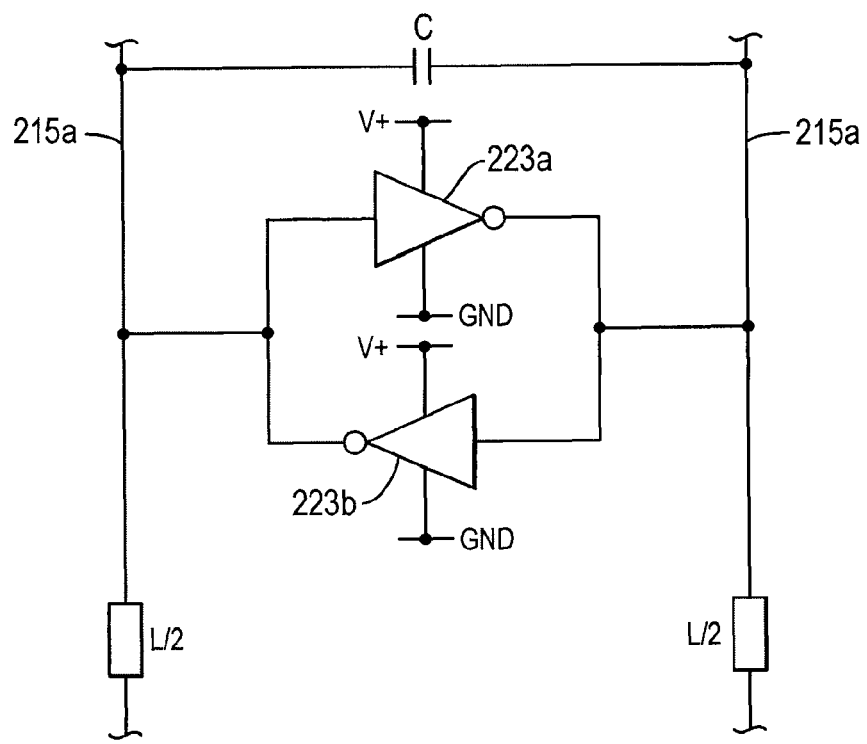
FIG. 10 shows a pair of back-to-back inverters connected across part of a transmission-line.

FIG. 10 shows a pair of back-to-back inverters 223a, 223b with supply line connectors and indications of distributed inductive (L/2) and capacitive (C) elements of a transmission-line as per FIG. 9b.

Figure 11A:
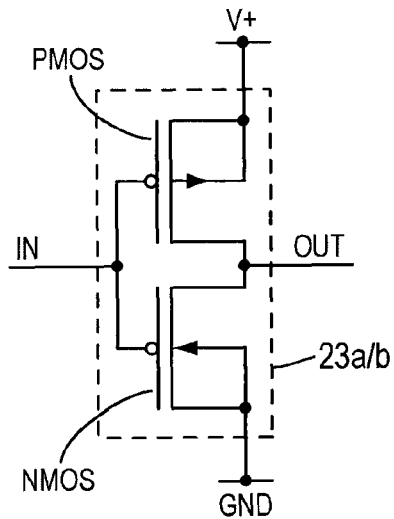
FIGS. 11a and 11b are outline and equivalent circuit diagrams of CMOS back-to-back inverters.

FIG. 11a shows N-channel and P-channel Mosfet implementation of the back-to-back inverters 223a and 223b, see out of NMOS and PMOS transistors.

Figure 11B:
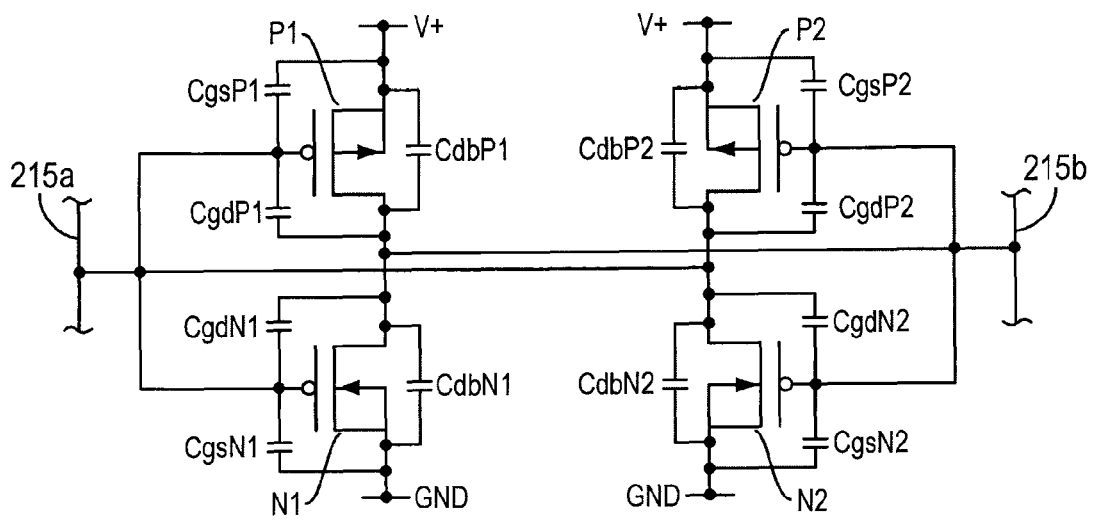

FIG. 11b shows an equivalent circuit diagram for NMOS (N1, N2) and PMOS (P1, P2) transistors, together with their parasitic capacitances. The gate terminals of transistors P1 and N1 are connected to the conductive trace 215a and to the drain terminals of transistors P2 and N2. Similarly, the gate terminals of transistors P2 and N2 are connected to the conductive trace 215b and to the drain terminals of transistors P1 and N1. The PMOS gate-source capacitances CgsP1 and CgsP2, the PMOS gate-drain capacitances CgdP1 and CgdP2, and the PMOS drain-source and substrate capacitances CdbP1 and CdbP2, also the NMOS gate-source capacitances CgsN1 and CgsN2, the NMOS gate-drain capacitances CgdN1 and CgdN2, and the NMOS drain-source and substrate capacitances CdbN1 and CdbN2 are effectively absorbed into the characteristic impedance Zo of the transmission-line, so have much less effect upon transit times of the individual NMOS and PMOS transistors. The rise and fall times of the waveforms Φ1 and Φ2 are thus much faster than for prior circuits.

Although the present invention has been described in considerable detail with reference to certain preferred versions thereof, other versions are possible. Therefore, the spirit and scope of the appended claims should not be limited to the description of the preferred versions contained herein.

What is claimed is:

1. A traveling wave oscillator comprising:
    a length of two-conductor transmission line;
    a polarity reversing means connected to the length of two-conductor transmission line to form an energy-continuous, two-conductor closed path for propagating a differential traveling wave that establishes a voltage polarity between the two conductors as its travels over the transmission line, said wave being capable of traveling in either of two directions on the transmission line, and said reversing means reversing the polarity of a wave that travels therethrough such that two laps of the closed path defines an oscillation at a point on the transmission line; and
    a plurality of regeneration elements, each connected between the conductors of the two conductor transmission line and at spaced apart positions along the two-conductor line, each regeneration element including a first gain portion operable to degenerate a wave traveling in the counterclockwise direction and regenerate a wave traveling in the clockwise direction, and a second gain portion operable to degenerate a wave traveling in a clockwise direction and regenerate a wave traveling in a counterclockwise direction, so that the direction of the traveling wave is reversible.

2. A traveling wave oscillator according to claim 1, wherein each of the regeneration elements is connected between a first and second tap point on the transmission line; and
    wherein a pair of load devices is connected at the first tap point between said gain portions and a first supply voltage to provide energy to a traveling wave.

3. A traveling wave oscillator according to claim 2, wherein the pair of load devices includes a pair of resistors.

4. A traveling wave oscillator according to claim 2, wherein the pair of load devices includes:
    a pair of NMOS transistors; and
    a pair of resistors connected as load devices to the pair of NMOS transistors.

5. A traveling wave oscillator according to claim 2, wherein the pair of load devices includes:
    a pair of NMOS transistors; and
    a pair of PMOS diodes.

6. A traveling wave oscillator according to claim 2, wherein the pair of load devices includes first and second PMOS transistors, each having a gate, source, and drain, the gate of the first PMOS transistor being connected to the drain of the second PMOS transistor, the gate of the second PMOS transistor being connected to the drain of the first PMOS transistor, the sources of the PMOS transistors being connected to the first supply voltage, and the drains of the PMOS transistors being connected to the first and second conductors respectively of the transmission line.

7. A traveling wave oscillator according to claim 2, wherein the first and second tap points for each regeneration element have a phase difference of 90 degrees for a wave traveling in the first direction and 270 degrees for a wave traveling in the second direction.

8. A traveling wave oscillator according to claim 1, wherein the first gain portion includes:
- a pair of transistors, each having a gate, source, and drain, the drains of the first transistor and second transistors being connected to the second and first conductors, respectively, of the transmission line at the first tap point, the gate of the first transistor being connected to the first conductor at the first tap point, the gate of the second transistor being connected to the first conductor at the second tap point;
- a pair of current sources each configured to sink a specified current to a second supply voltage;
- a switch having an enable that, when active, connects a current source to each of source of each transistor; and
- a capacitor connected to each of the current sources.

9. A traveling wave oscillator according to claim 1, wherein the second gain portion includes:
- a pair of transistors, each having a gate, source, and drain, the drains of the first transistor and second transistors being connected to the second and first conductors, respectively, of the transmission line at the first tap point, the gate of the first transistor being connected to the second conductor at the first tap point, and the gate of the second transistor being connected to the second conductor at the second tap point;
- a pair of current sources each having an output that sinks a specified current to a second supply voltage;
- a switch having an enable that, when active, connects a current source to each of source of each transistor; and
- a capacitor connected to the output of each current source.

10. A method for reversing the direction of a traveling wave on a rotary traveling wave oscillator, said oscillator including a length of two-conductor transmission line, and a polarity reversing means connected to the length of two-conductor transmission line to form an energy-continuous, two-conductor closed path for propagating a differential traveling wave, said reversing means reversing the polarity of a wave that travels therethrough such that two laps of the closed path defines an oscillation at a point on the transmission line, the method comprising:
- providing a differential wave traveling in a first direction on the closed energy-continuous path; and
- while the wave is traveling in the first direction, providing, at a plurality of points on the closed path and based on the first direction, positive resistances to degenerate the wave traveling in the first direction, and providing, at the plurality of points on the closed loop and based on a second direction opposite to the first, negative resistances, to generate and maintain a wave traveling in the second direction, so as to destroy the wave traveling in the first direction and establish a wave traveling in the second direction.

11. A method for reversing the direction of a traveling wave as recited in claim 10, wherein the step of providing a positive resistance at a point on the closed loop is performed by connecting a positive resistance device between a first tap position on the path and a second tap position on the path, the first tap position being n degrees away traveling in the first direction from the second tap position.

12. A method for reversing the direction of a traveling wave as recited in claim 11, wherein n is either 90 or 270 degrees, depending on whether the first direction is clockwise or counterclockwise.

13. A method for reversing the direction of a traveling wave as recited in claim 10, wherein the step of providing a negative resistance at a point on the closed loop is performed by connecting a negative resistance device between a first tap position on the path and a second tap position on the path, the first tap position being n degrees away traveling in the second direction from the second tap position.

14. A method for reversing the direction of a traveling wave as recited in claim 13, wherein n is either 270 or 90 degrees, depending on whether the second direction is clockwise or counterclockwise.

15. A traveling wave oscillator comprising:
- a length of two-conductor transmission line;
- a polarity reversing means connected to the length of two-conductor transmission line to form an energy-continuous, two-conductor closed path for propagating a differential traveling wave that establishes a voltage polarity between the two conductors as its travels over the transmission line, said wave being capable of traveling in either of two directions on the transmission line, and said reversing means reversing the polarity of a wave that travels therethrough such that two laps of the closed path defines an oscillation at a point on the transmission line; and
- a plurality of regeneration elements, each connected between the conductors of the two conductor transmission line and at spaced apart positions along the two-conductor line, each regeneration element including a gain portion operable to degenerate a wave traveling in the one direction and regenerate a wave traveling in the other direction, so that the wave travels in a preferred direction.

16. A traveling wave oscillator according to claim 15,
wherein each of the regeneration elements is connected between a first and second tap point on the transmission line; and
wherein a pair of load devices is connected at the first tap point between said gain portion and a first supply voltage to provide energy to a traveling wave.

17. A traveling wave oscillator according to claim 16, wherein the pair of load devices includes a pair of resistors.

18. A traveling wave oscillator according to claim 16, wherein the pair of load devices includes:
- a pair of NMOS transistors; and
- a pair of resistors connected as load devices to the pair of NMOS transistors.

19. A traveling wave oscillator according to claim 16, wherein the pair of load devices includes:
- a pair of NMOS transistors; and
- a pair of PMOS diodes.

20. A traveling wave oscillator according to claim 16, wherein the pair of load devices includes first and second PMOS transistors, each having a gate, source, and drain, the gate of the first PMOS transistor being connected to the drain of the second PMOS transistor, the gate of the second PMOS transistor being connected to the drain of the first PMOS transistor, the sources of the PMOS transistors being connected to the first supply voltage, and the drains of the PMOS transistors being connected to the first and second conductors respectively of the transmission line.

21. A traveling wave oscillator according to claim 16, wherein the first and second tap points for each regeneration element have a phase difference of 90 degrees for a wave traveling in the first direction and 270 degrees for a wave traveling in the second direction.

22. A traveling wave oscillator according to claim 15, wherein the gain portion includes:
- a pair of transistors, each having a gate, source, and drain, the drains of the first transistor and second transistors being connected to the second and first conductors, respectively, of the transmission line at the first tap point, the gate of the first transistor being connected to the first conductor at the first tap point, the gate of the second transistor being connected to the first conductor at the second tap point;
- a pair of current sources each configured to sink a specified current to a second supply voltage;
- a switch having an enable that, when active, connects a current source to each of source of each transistor; and
- a capacitor connected to each of the current sources.

23. A method for establishing a direction of a traveling wave on a rotary traveling wave oscillator, said oscillator including a length of two-conductor transmission line, and a polarity reversing means connected to the length of two-conductor transmission line to form an energy-continuous, two-conductor closed path for propagating a differential traveling wave, said reversing means reversing the polarity of a wave that travels therethrough such that two laps of the closed path defines an oscillation at a point on the transmission line, the method comprising:
- providing, at a plurality of points on a closed energy-continuous path and based on a preferred direction, positive resistances to degenerate any wave traveling opposite to the preferred direction; and
- providing, at the plurality of points on the closed loop and based on the preferred direction, negative resistances, to generate and maintain a wave traveling in the preferred direction.

* * * * *